(12) United States Patent
Wessel

(10) Patent No.: US 6,646,501 B1
(45) Date of Patent: Nov. 11, 2003

(54) POWER AMPLIFIER CONFIGURATION

(75) Inventor: David N Wessel, Woodlawn (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/179,636

(22) Filed: Jun. 25, 2002

(51) Int. Cl.[7] .............. H03F 3/38; H03F 1/26; H03G 3/20; H03G 3/00
(52) U.S. Cl. .............. 330/10; 330/136; 330/127; 330/149
(58) Field of Search .............. 330/10, 127, 136, 330/149

(56) References Cited

U.S. PATENT DOCUMENTS

| | | | | |
|---|---|---|---|---|
| 4,442,407 A | * | 4/1984 | Apel ............ | 330/128 |
| 4,994,757 A | * | 2/1991 | Bickley et al. ............ | 330/285 |
| 5,675,288 A | * | 10/1997 | Peyrotte et al. ............ | 330/149 |
| 5,781,069 A | * | 7/1998 | Baskin ............ | 330/149 |
| 5,892,404 A | * | 4/1999 | Tang ............ | 330/297 |
| 6,191,653 B1 | * | 2/2001 | Camp et al. ............ | 330/129 |

* cited by examiner

Primary Examiner—Patricia Nguyen
(74) Attorney, Agent, or Firm—Barnes & Thornburg

(57) ABSTRACT

Power amplifier arrangements, methods, and software arranged to receive a power input which is voltage-modulated responsive to at least one control signal representative of the data signal. The data input to the power amplifier is pre-distorted and the resulting power amplification is substantially linear. The arrangement may be used in wireless base station transmitters, but is not limited to such applications. Improved data transmission services are also provided which make use of such power amplifiers.

13 Claims, 5 Drawing Sheets

POWER AMPLIFIER CONFIGURATION

FIELD OF THE INVENTION

The present Invention relates to a method and apparatus for power amplification and a system incorporating the same. The invention is particularly, but not exclusively, intended for use in a wireless communications base station.

BACKGROUND TO THE INVENTION

Known wireless communications systems require provision of a high power signal for transmission in order to ensure reception over a suitably wide area. This is achieved by amplifying the data signal to be transmitted, typically at a wireless base station itself, and feeding the resulting amplified signal to the antenna array for wireless transmission. The high amplification levels required for such applications can lead to non-linear distortion of the data signal, which is undesirable. It is therefore highly desirable to use high-performance, linear power amplifier architectures in such applications.

A problem with known linear Power Amplifier (PA) technology is that a static back-off, proportional to the signal statistics (Complementary Cumulative Distribution Function (CCDF)), is required to obtain linearity in the system. This back-off decreases the maximum obtainable efficiency of the system and drives mechanical, thermal, and overhead powering costs for wireless transmit architectures. Known techniques yield PA efficiencies in the order of 10–12% for high power designs for signals with high peak-to-mean ratios such as Code Division Multiple Access (CDMA) and Wideband CDMA (W-CDMA). It is therefore desirable to improve the efficiency of power amplifiers so as to reduce operating costs.

Known solutions include Envelope Elimination and Recovery (EER) but such solutions have limited performance due to cross modulation induced by varying the DC voltage applied to the device output. EER cannot be easily incorporated in a wideband architecture since the cross modulation ultimately limits the system linearity and hence limits the ability to meet current standards requirements. Significant memory components are added to the signal envelope at wide bandwidths thus creating an inherently non-linear system.

Power amplifiers today account for a high proportion of wireless Basestation Transmitter System (BTS) costs. In addition, infrastructure support for the power amplifiers (in terms of mechanical, cooling, and DC powering), combined with the basic power amplifiers costs, total a majority of BTS costs. It Is therefore desirable to identify means whereby to reduce installation and/or operating costs of such systems.

OBJECT OF THE INVENTION

The present invention seeks to provide an improved method and apparatus for power amplification and especially for linear power amplification, both in wireless base station applications and elsewhere.

SUMMARY OF THE INVENTION

According to a first aspect of the present invention there is provided a power amplifier arrangement comprising: a power amplifier comprising an input port for receiving a data signal and an output port for providing an amplified data signal responsive to the data signal; a power supply arranged to supply power to the power amplifier, the power supply being arranged to be modulated responsive to the data signal.

In a preferred embodiment, the power amplifier further comprises: a predistorter arranged to provide the data signal responsive to receipt of an unpredistorted data signal.

In this context, it will be understood by the skilled person that the unpredistorted signal is unpredistorted relative to the data signal, and does not preclude predistortion for purposes other than the present power amplification.

Advantageously, the predistorter is arranged to correct any non-linearities induced by the power supply modulation, memory components produced as a result of the power supply modulation and the inherent device non-linearities, whereby to provide a substantially linear amplifier performance.

Preferably, the power supply is arranged to be modulated responsive to at least one of the unpredistorted data signal, the data signal, and the amplified data signal.

In another preferred embodiment, the data signal is one of a CDMA signal and a W-CDMA signal. Where predistortion is employed, the data signal in this context will be understood to refer to the unpredistorted signal.

According to a further aspect of the present invention there is provided a power amplifier arrangement comprising: a power amplifier arranged to amplify a data signal; a power supply arranged to provide power to the power amplifier; a power supply modulator arranged to receive the data signal and to modulate the voltage provided by the power supply to the power amplifier responsive to at least one of the data signal, and the amplified data signal.

In a preferred embodiment, the power amplifier arrangement additionally comprises: a predistorter arranged to provide the data signal responsive to receipt of an unpredistorted data signal; and in which the power supply modulator is arranged to modulate the voltage responsive to at least one of the unpredistorted data signal, the data signal, and the amplified data signal.

The invention also provides for a system for the purposes of communications which comprises one or more instances of apparatus embodying the present invention, together with other additional apparatus.

In particular, the invention also provides for a wireless communications base station transmitter, a wireless communications base station, and a communications network comprising such a power amplifier arrangement.

According to a further aspect of the present invention there is provided a power supply modulator arrangement comprising: a first port arranged to receive a data signal; a second port arranged to emit power supply control signals responsive to the data signal; a third port arranged to receive a signal representative of the data signal and the power supply control signals.

The invention is also directed to methods by which the described apparatus operates and including method steps for carrying out every function of the apparatus.

In particular, according to a further aspect of the present invention there is provided a method of amplifying a data signal using a power amplifier having a power supply input, the method comprising the steps of: receiving the data signal; amplifying the data signal using the power amplifier whereby to provide an amplified data signal; modulating the power supply input to the power amplifier responsive the amplified data signal.

According to a further aspect of the present invention there is provided a method of improving power amplifier efficiency comprising the steps of: providing a power amplifier arranged to receive a data signal and to provide an amplified data signal; modulating power supplied to the power amplifier responsive to the amplified data signal.

Other aspects of the invention include software for implementing the amplifier arrangement or for carrying out (which encompasses controlling) the method steps. This acknowledges that such software can be a valuable, separately tradable commodity. Such software is intended to encompass software which runs on or controls "dumb" or standard hardware, to carry out the desired functions, (and therefore the software essentially defines the functions of the arrangement). For similar reasons, it is also intended to encompass software (such as HDL (hardware description language) software) which describes or defines the configuration of hardware, as is used for designing silicon chips, or for configuring universal programmable chips, to carry out desired functions.

In particular, according to a further aspect of the present invention there is provided a program for a computer for controlling a power amplifier arrangement comprising a power amplifier and a power amplifier power supply unit, the program comprising code portions arranged to: receive a first signal representative of a data input signal to the power amplifier; receive a signal representative of an data output signal from the power amplifier; control modulation of the power supply responsive to receipt of the first and second signals.

Another aspect provides a method of offering or providing a data transmission service over a network using such a power amplifier. As the advantages of the invention can enable a better network, which is more reliable or more flexible, or has greater capacity, or is more cost effective for example, consequently a data transmission service over the network can show a corresponding improvement, and the value of such services can increase. Such increased value over the life of the system, could prove far greater than the sales value of the equipment.

Advantageously, power amplification costs are improved. Advantageously, the cost of ownership of such equipment to customers is also reduced, both in terms of long term AC power costs and in terms of improved reliability due to reduced thermal loading on the BTS.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

Figure 1:
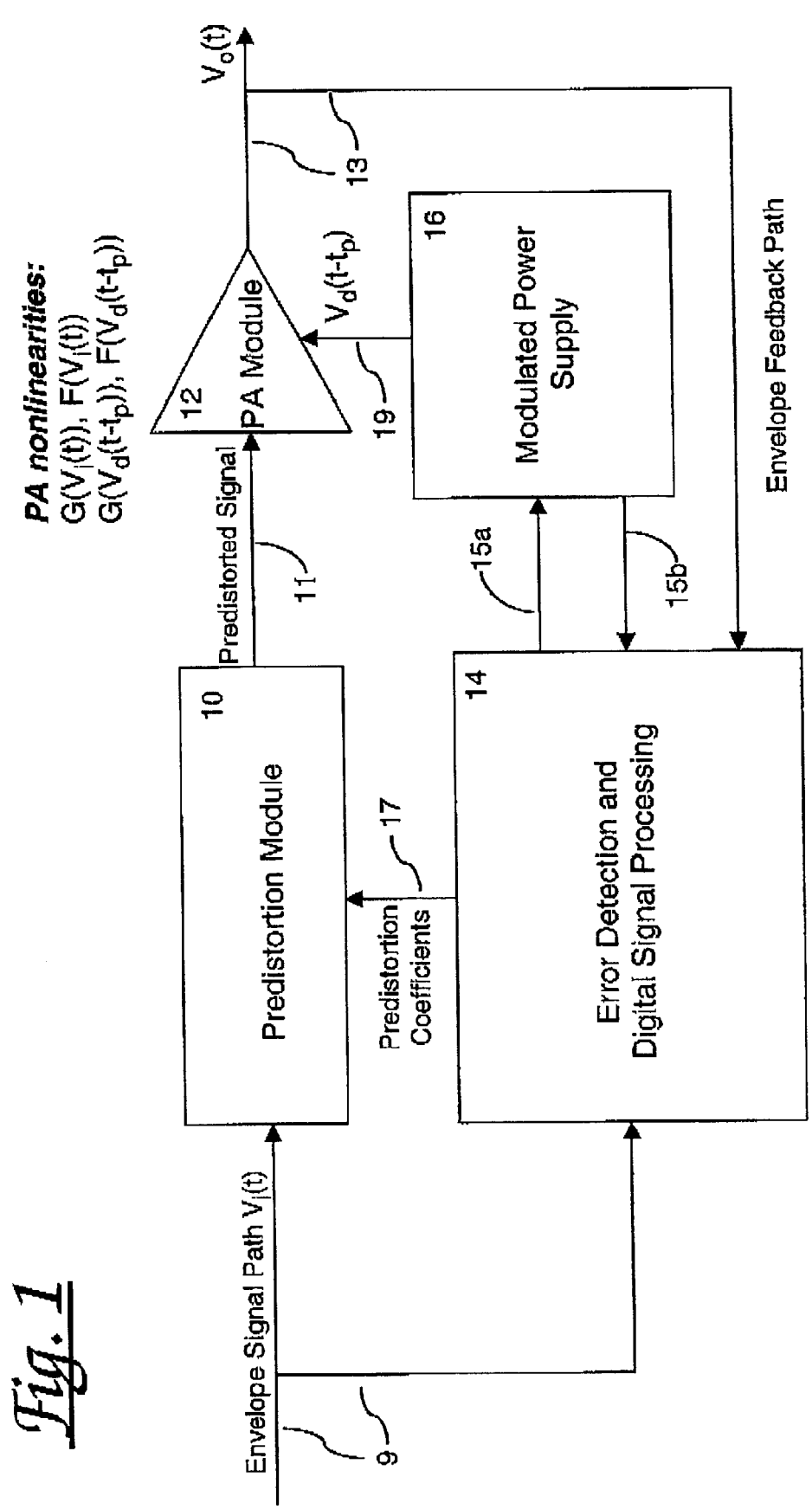
FIG. 1 shows a power amplifier arrangement according to the present invention.

Referring to FIG. 1, there is shown a power amplifier arrangement comprising a predistortion module 10, a power amplifier module 12, an error detection and digital signal processing unit 14, and a modulated power supply 16. In this arrangement an envelope signal path 9 is arranged to provide the envelope signal both to the predistortion module 10 and the error detection and digital signal processing unit 14, the error detection and digital signal processing unit being arranged to provide 17 the predistortion coefficients to the predistortion module. The predistortion module provides 11 a predistorted version of the envelope signal to the power amplifier module 12 which in turn provides 13 an amplified version of the predistorted signal. The modulated power supply 16 provides 19 a power input to the power amplifier module 12, responsive to inputs 15a received from the error detection and digital signal processing unit 14. The error detection and digital signal processing unit 14 receives feedback both from 15b the modulated power supply and from 13 the output from the power amplifier module.

The arrangement provides active DC power supply modulation in power amplifier arrangement whereby to improve and optimise the power amplifier efficiency in high dynamic range signals including, but not limited to, CDMA and W-CDMA. The error detection and digital signal processing unit 14 detects the input waveform which may then be used 15a to control the modulated power supply 16 in such a way as to allow the power amplifier module 12 to operate very close to its compression point at all times during the envelope: that is, to operate the device effectively at the maximum available power for a given supply voltage. When operating within the linear region of the amplifier, gain is substantially uniform. As the input signal is increased in power, a point is reached where the input signal is not amplified by the same amount as lower power input signals. This point is known as the compression point. Operation very close to the compression point facilitates operation of the power amplifier module at its highest efficiency point.

The power supply output voltage is modulated in such a manner as to reduce the output voltage proportional to the reduction in the envelope voltage in order to operate the RF power devices at a point very near maximum compressed power over the entire envelope range.

The predistortion module 10 is arranged to compensate for Amplitude Modulation/Amplitude Modulation (AM/AM) and Amplitude Modulation/Phase Modulation (AM/PM) conversion distortion, created as a result of application of the DC bias modulation to the power amplifier module as well as inherent device nonlinearities, so as to provide a substantially linear amplification characteristic over the operating range of the arrangement. The scheme differs from the classic envelope illumination and recovery (EER) techniques at least in that it allows the composite waveform to propagate through the entire system, thus allowing effective predistortion of the envelope signal and yielding a linear composite output from the power amplifier. Additionally it compensates for memory produced in the system as a result of imperfections in the tracking of the power supply to the signal envelope.

The signal input waveform is sampled.

The sample is then processed to determine the exact value of DC voltage to apply to the output devices for the waveform power level. Simultaneous to this process, the waveform sample is used to determine the optimum predistortion coefficients to apply to the waveform to ensure the system linearity.

The input wave is time delayed to allow for proper processing and envelope alignment of the pre-distortion coefficients and proper timing of the DC power supply modulation on the waveform.

Separately, in an offline process, the output waveform is sampled and compared to the clean input waveform to actively adapt both the pre-distortion and DC modulation coefficients to optimise the system efficiency and linearity.

Preferably, the power amplifier transfer characteristic is dependent on power supply unit (PSU) supply voltage, which is being modulated, and the input envelope modulation. A preferred power amplifier transfer characteristic is:

Gain=f(envelope voltage, PSU voltage)
Phase=f(envelope voltage, PSU voltage)
Efficiency=f(Psat, Pout); Psat=f(envelope voltage).

Figure 2:
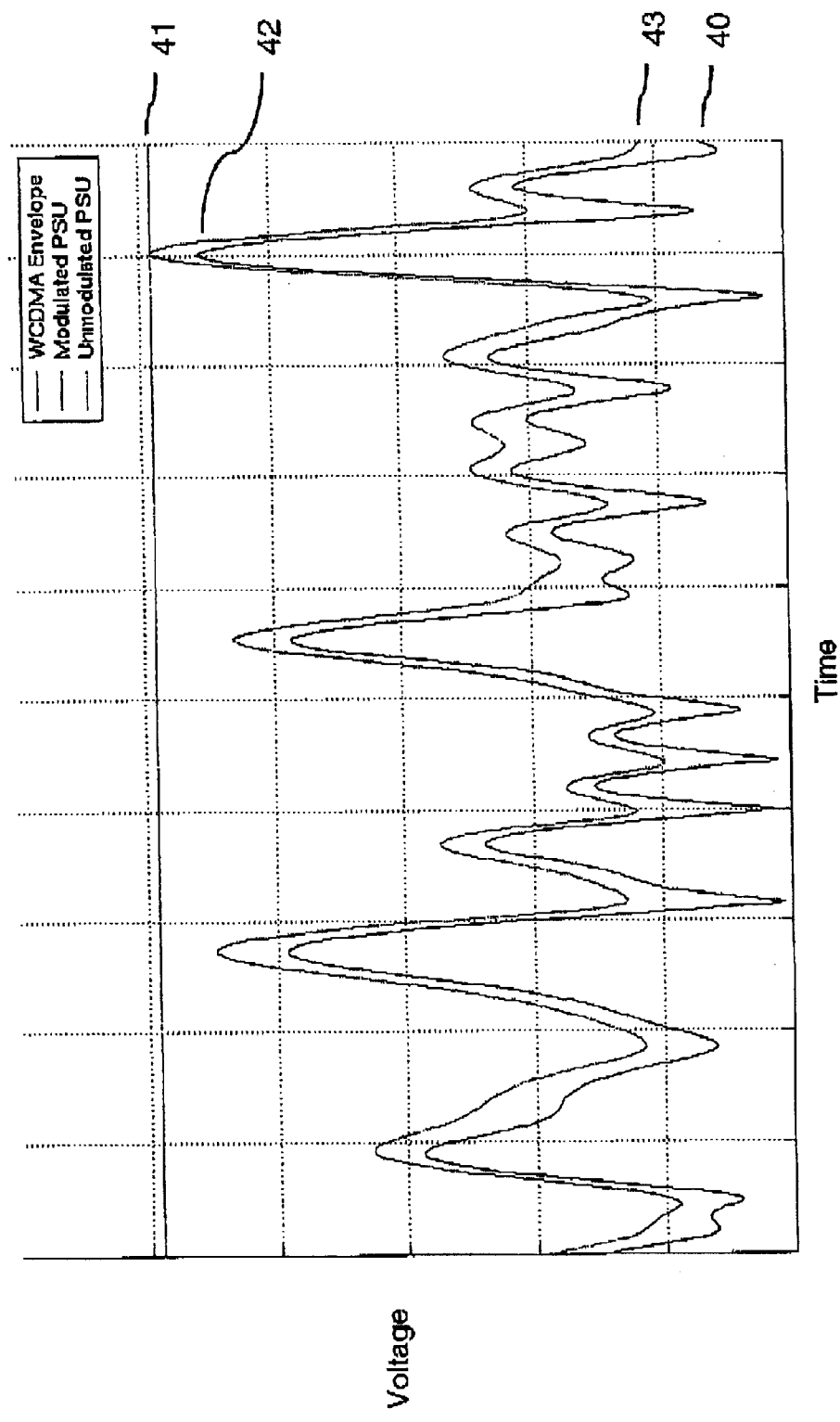
FIG. 2 shows a graph of an example of modulation of a power supply in accordance with the present invention.

Referring now to FIG. 2, there is shown a graphical representation of the respective voltages over time of:

- an output signal envelope 40;
- a conventional amplifier which holds power supply voltage (Vdd) constant 41 at a level sufficient to amplify the peaks 42 in the data signal envelope; and
- the dynamically modulated power supply voltage (Vdd) envelope 43 arranged to follow the data signal envelope 40.

As the graph shows, modulation of the power supply voltage to track the signal envelope significantly reduces amplifier power wastage, as represented by the difference in power between the dynamically modulated power supply voltage 43 and the conventional constant voltage 41. For example, studies have shown that for an unmodulated power supply having an average efficiency of approximately 13%, a corresponding efficiency of 27.5% can be achieved using supply voltage modulation of the power supply unit according to the present technique.

Figure 3:
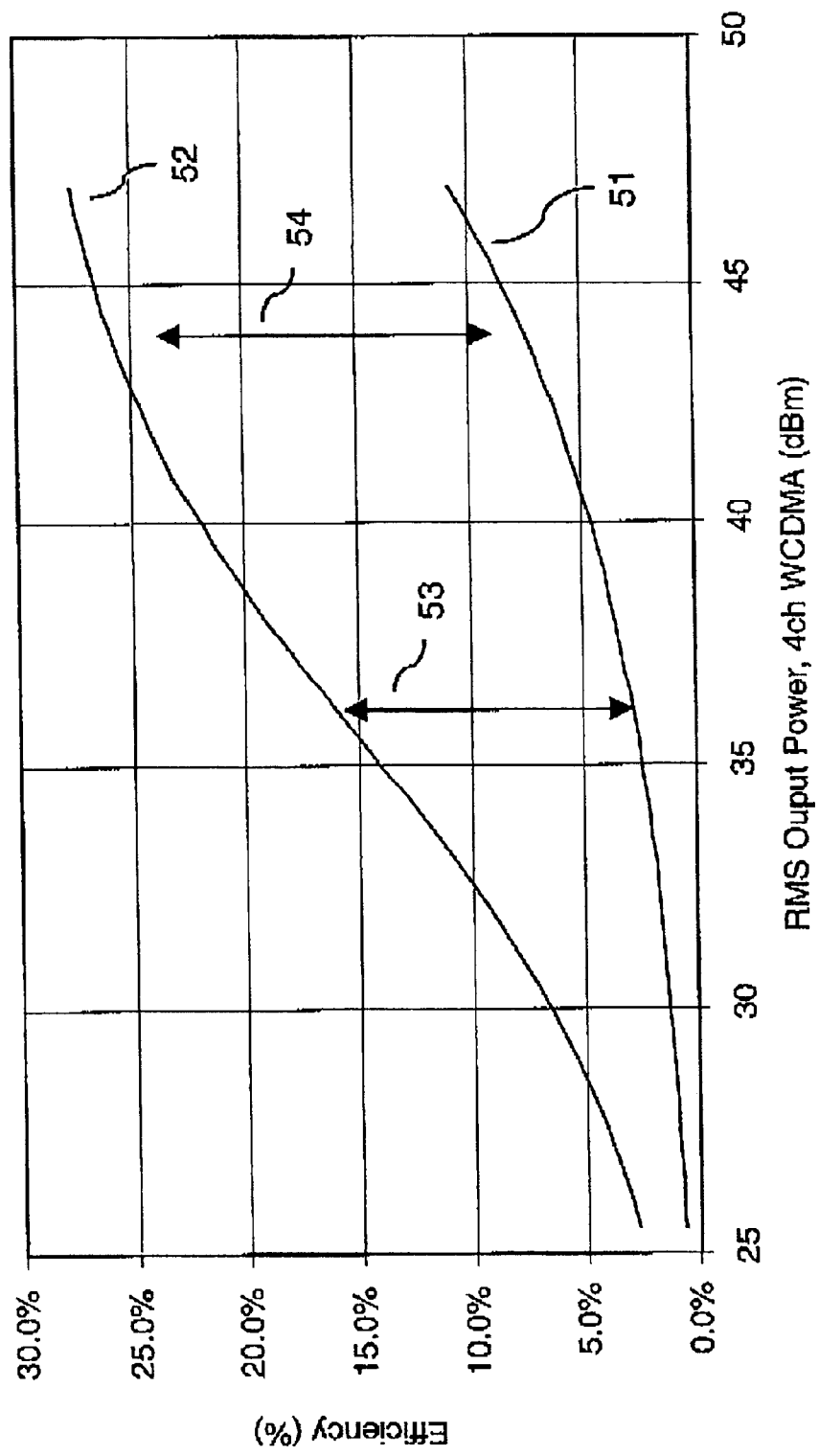
FIG. 3 shows an example graph illustrating improved amplifier efficiency in accordance with the present inventions.

Referring now to FIG. 3, there is shown a graphical representation of the relationship between average power efficiency and RMS output power of a PA arrangement for a four channel W-CDMA system. The graph shows a first plot 51 of efficiency for a conventional amplifier arrangement having a static power supply voltage, Vdd, and a second plot 52 showing a corresponding efficiency for a similar arrangement but in which the power supply voltage is dynamically modulated to follow the signal envelope. As the graph shows, efficiency degrades gracefully over the power control range as the linearizer overhead starts 53 to dominate, but significant benefit 54 can still be obtained even at reduced powers.

Figure 4:
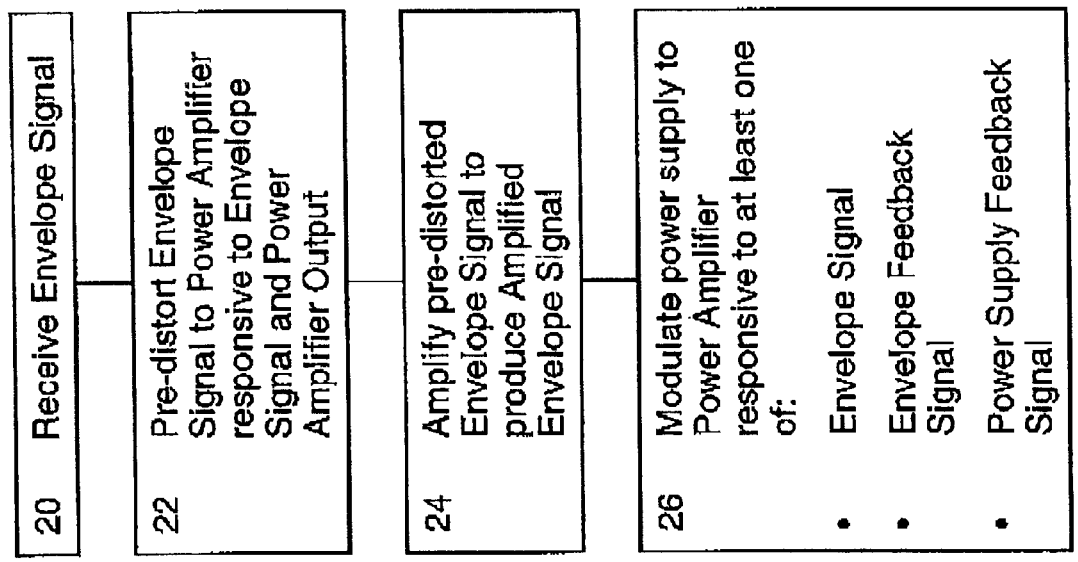
FIG. 4 shows a power amplification method according to the present invention.

Referring now to FIG. 4, the method comprises the steps of: receiving 20 an envelope signal; predistorting 22 the envelope signal to provide a predistorted input to the power amplifier compensating for non-linearities introduced elsewhere in the arrangement; amplifying 24 the predistorted envelope signal to produce an amplified envelope signal; and modulating 26 the power supply to the power amplifier. The modulation is performed responsive to at least one of the envelope signal 9, the envelope feedback signal 13, and the power supply feedback signal 15*b*.

Figure 5:
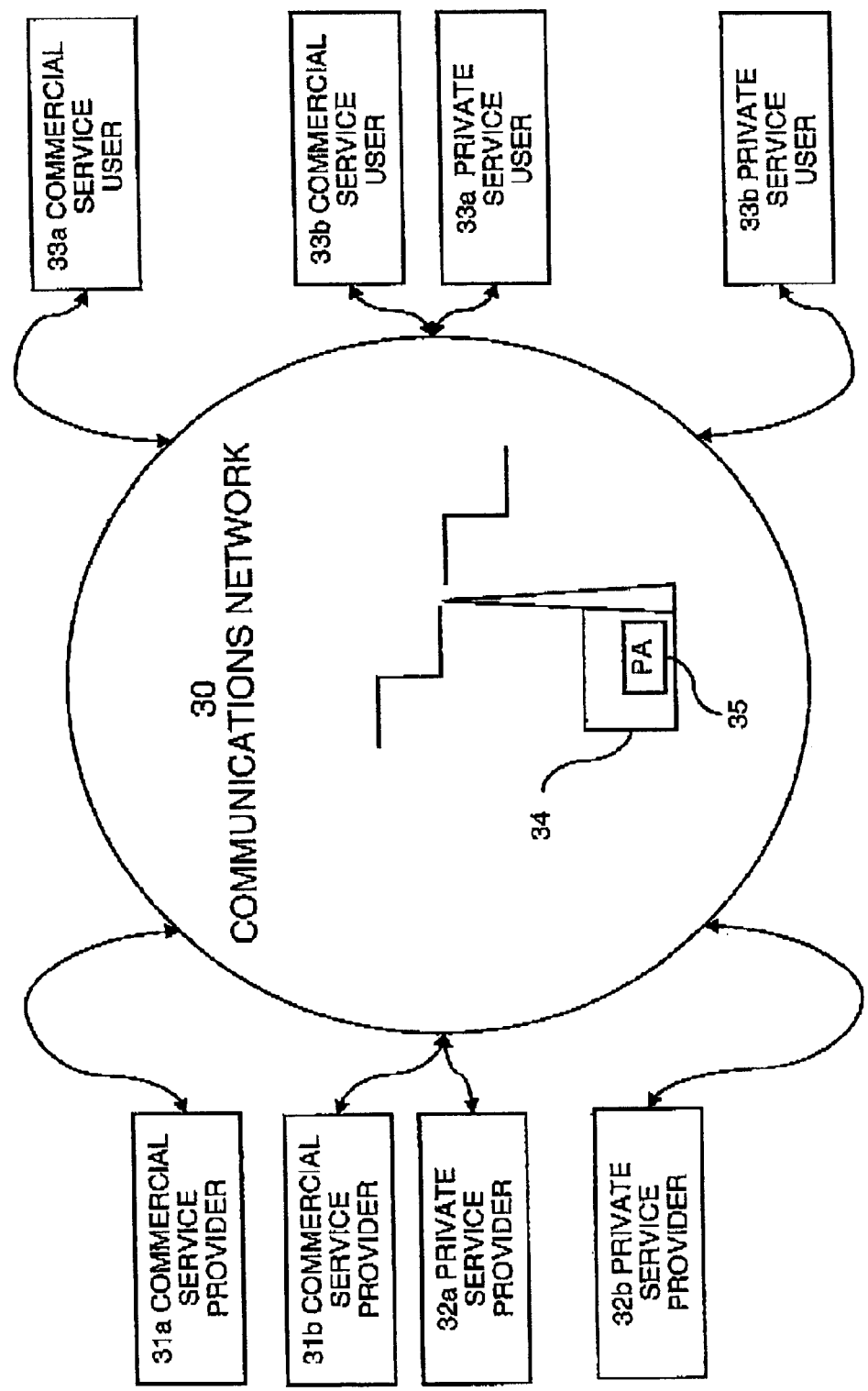
FIG. 5 shows a example data transmission service offered over a communications network utilising a power amplifier arrangement according to the present invention.

Referring now to FIG. 5, the power amplifier provides an improved quality of service for data transmission services provided over a network 30 utilising such power amplifier arrangements 35. In the example illustrated the PA arrangement is provided in a wireless base station 34. Such services may be provided between commercial 31*a–b* or private 32*a–b* service providers, and commercial 33*a–b* or private 34*a–b* subscribers. As is well understood in the art, a single entity may act either as provider or consumer or both in respect of any such service or services.

Any range or device value given herein may be extended or altered without losing the effect sought, as will be apparent to the skilled person for an understanding of the teachings herein.

What is claimed is:

1. A power amplifier comprising:
   a power amplifier for receiving an input signal and amplifying said input signal to form an output signal;
   a power supply for supplying a power supply voltage to the power amplifier;
   a signal processing unit for receiving said input signal and for providing a control signal to the power supply, said signal processing unit including means for forming said control signal responsive to said input signal;
   wherein the power supply modulates the power supply voltage in response to the control signal so as to vary said power supply voltage proportionally with respect to changes in the input signal; and
   wherein the input signal to the power amplifier is time delayed to allow the power supply voltage to be modulated in time with amplification of the input signal by the power amplifier.

2. A power amplifier arrangement according to claim 1, further comprising a predistortion module for providing a predistorted version of the input signal to the power amplifier, said predistortion module receiving from the signal processing unit predistortion coefficients for distorting said input signal, said predistortion coefficients being formed by said signal processing unit responsive to said input signal.

3. A power amplifier arrangement according to claim 1, wherein the signal processing unit receives a feedback signal from at least one of the power amplifier and the power supply and wherein said control signal formed by the signal processing unit is formed using at least one of the input signal, a power supply feedback signal and a power amplifier feedback signal.

4. A method of operating a power amplifier, comprising the steps of:
   providing an input signal to the power amplifier, the power amplifier amplifying the input signal to form an output signal;
   providing a power supply voltage to the amplifier to enable the power amplifier to amplify the input signal;
   modulating the power supply voltage to the power amplifier in response to a control signal received by the power supply from a signal processing unit, said signal processing unit forming said control signal responsive to the input signal, wherein the power supply modulates the power supply voltage so as to vary said power supply voltage proportionally with respect to changes in the input signal; and
   time delaying inputting of the input signal to the power amplifier in order to allow the power supply voltage to be modulated in time with amplification of the input signal by the power amplifier.

5. A method according to claim 4, further comprising the step of predistorting the input signal so as to provide the power amplifier with a predistorted version of the input signal for amplification.

6. A method according to claim 5, wherein the input signal is predistorted by a predistortion module which receives predistortion coefficients generated by the signal processing unit, said predistortion coefficients being generated by the signal processing unit responsive to the input signal.

7. A method according to claim 4, wherein it further comprises providing to the signal processing unit a feedback signal from at least one of the power amplifier and the power supply and wherein the control signal is formed by the signal processing unit utilising at least one of the input signal, a power supply feedback signal and a power amplifier feedback signal.

8. A wireless communications basestation transmitter including a power amplifier arrangement according to claim 1.

9. A wireless communications basestation transmitter including a power amplifier arrangement according to claim 1.

10. A communications network including a power amplifier arrangement according to claim 1.

11. A method of amplifying a signal using a power amplifier having a power supply input, the method comprising the steps of:

receiving the input signal;

amplifying the input signal using the power amplifier to provide an output signal;

modulating the power supply input to the power amplifier in accordance with a control signal responsive to said input signal, wherein the method includes the step of time delaying inputting of the input signal to the power amplifier to allow the power supply input to be modulated in time with amplification of the input signal by the power amplifier.

12. A program for a computer for controlling a power amplifier arrangement comprising a power amplifier, a power supply and a signal processing unit, the program comprising code to carry out the steps of:

providing an input signal to the power amplifier, the power amplifier amplifying the input signal to form an output signal;

providing a power supply voltage to the amplifier to enable the power supply voltage to the amplifier to enable the power amplifier to amplify the input signal;

modulating the power supply voltage to the power amplifier in response to a control signal received by the power supply from a signal processing unit, said signal processing unit forming said control signal responsive to the input signal, wherein the power supply modulates the power supply voltage so as to vary said power supply voltage proportionally with respect to changes in the input signal; and time delaying inputting of the input signal to the power amplifier in order to allow the power supply voltage to be modulated in time with amplification of the input signal by the power amplifier.

13. A method of providing a signal transmission service over a communications network including a power amplifier arrangement according to claim 1.

* * * * *